US012676456B2

(12) United States Patent
Van Asselt et al.

(10) Patent No.: US 12,676,456 B2
(45) Date of Patent: Jul. 7, 2026

(54) ROBUST AND INTRINSICALLY SAFE LASER FAILURE DETECTION IN THE ELECTRICAL CIRCUIT

(71) Applicant: SIGNIFY HOLDING B.V., Eindhoven (NL)

(72) Inventors: Robert Van Asselt, Valkenswaard (NL); Rifat Ata Mustafa Hikmet, Eindhoven (NL); Dominique Maria Bruls, Heeze (NL); Ties Van Bommel, Horst (NL); Hugo Johan Cornelissen, Escharen (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 477 days.

(21) Appl. No.: 18/271,695

(22) PCT Filed: Jan. 4, 2022

(86) PCT No.: PCT/EP2022/050041
§ 371 (c)(1),
(2) Date: Jul. 11, 2023

(87) PCT Pub. No.: WO2022/152591
PCT Pub. Date: Jul. 21, 2022

(65) Prior Publication Data
US 2024/0079852 A1 Mar. 7, 2024

(30) Foreign Application Priority Data
Jan. 12, 2021 (EP) ..................................... 21151060

(51) Int. Cl.
*H01S 5/068* (2006.01)
*H01S 3/13* (2006.01)
(Continued)

(52) U.S. Cl.
CPC ........ *H01S 5/06825* (2013.01); *H01S 3/1305* (2013.01); *H01S 5/0087* (2021.01); *H01S 5/0262* (2013.01)

(58) Field of Classification Search
CPC .. H01S 5/06825; H01S 3/1305; H01S 5/0087; H01S 5/0262; H05B 47/26; H05B 45/50; F21S 41/16; F21S 45/70
See application file for complete search history.

(56) References Cited

U.S. PATENT DOCUMENTS

| | | | |
|---|---|---|---|
| 10,408,413 | B2 | 9/2019 | Khrushchev |
| 10,587,090 | B1 | 3/2020 | Raring et al. |

(Continued)

FOREIGN PATENT DOCUMENTS

| | | |
|---|---|---|
| CN | 102089945 A | 6/2011 |
| CN | 106461182 A | 2/2017 |

(Continued)

*Primary Examiner* — Yuanda Zhang

(57) ABSTRACT

The invention provides a light generating system (1000) comprising a solid state light source (100), a luminescent material element (210), a sensor element (400), and an electrical circuit (500), wherein: (a) the solid state light source (100) is configured to generate light source light (101), wherein the solid state light source (100) is functionally coupled to the electrical circuit (500); (b) the luminescent material element (210) comprises a luminescent material (200), wherein the luminescent material element (210) is configured in a light receiving relationship with the solid state light source (100), and wherein the luminescent material (200) is configured to convert at least part of the light source light (101) into luminescent material light (201); and (c) the sensor element (400) comprises a sensor component (410), wherein the sensor element (400) is comprised by the electrical circuit (500), wherein the sensor component (410) comprises a photo-resistor, wherein the photo-resistor has a variable resistance dependent on an extend of exposure to a (Continued)

light (11) selected from the group consisting of the laser light (100) and the luminescent material light (201).

14 Claims, 6 Drawing Sheets

(51) Int. Cl.
  *H01S 5/00* (2006.01)
  *H01S 5/026* (2006.01)

(56) References Cited

U.S. PATENT DOCUMENTS

| | | | |
|---|---|---|---|
| 2013/0015771 A1* | 1/2013 | Chen | H05B 47/11 |
| | | | 315/158 |
| 2015/0146752 A1 | 5/2015 | Ikegami | |
| 2016/0290856 A1 | 10/2016 | Fiederling et al. | |
| 2019/0264894 A1 | 8/2019 | Aketa | |
| 2020/0011506 A1 | 1/2020 | Mao et al. | |

FOREIGN PATENT DOCUMENTS

| | | | | |
|---|---|---|---|---|
| CN | 106662304 A | 5/2017 | | |
| CN | 107195157 A * | 9/2017 | | G08B 13/183 |
| CN | 109827137 A | 5/2019 | | |
| EP | 3457021 A1 | 3/2019 | | |

* cited by examiner

ROBUST AND INTRINSICALLY SAFE LASER FAILURE DETECTION IN THE ELECTRICAL CIRCUIT

CROSS-REFERENCE TO PRIOR APPLICATIONS

This application is the U.S. National Phase application under 35 U.S.C. § 371 of International Application No. PCT/EP2022/050041, filed on Jan. 4, 2022, which claims the benefit of European Patent Application No. 21151060.7, filed on Jan. 12, 2021. These applications are hereby incorporated by reference herein.

FIELD OF THE INVENTION

The invention relates to a light generating system as well as to a light generating device comprising such light generating system.

BACKGROUND OF THE INVENTION

Safe laser light is addressed in the art. U.S. Pat. No. 10,587,090, for instance, describes a device and method for an eye safe electromagnetic radiation source using a combination of laser diode excitation source or waveguide gain element such as superluminescent diode (SLED) based on gallium and nitrogen containing materials and light emitting/conversion source based on phosphor materials. In some embodiments of U.S. Pat. No. 10,587,090 a violet emitting, blue emitting, or other wavelength emitting waveguide gain element or laser diode source based on gallium and nitrogen materials is closely integrated with phosphor materials, such as yellow phosphors or a red and green phosphor, or a red, yellow, and green phosphor, to form a compact, high-brightness, and highly-efficient, white light source with novel configurations designed for eye safety. Specifically, the configurations for safety are designed to prevent environmental exposure of laser beams in case the light sources were to become compromised. In some embodiments of U.S. Pat. No. 10,587,090, the safety features are designed to terminate lasing action from the laser based light source by altering the electrical circuit, optical circuit, or optical feedback into the laser gain element to drop the laser below the threshold condition. In some examples of U.S. Pat. No. 10,587,090, all optical output power from the laser based light source would cease and in other cases the output optical power level and coherence would be greatly reduced to an eye safe level. In all embodiments of U.S. Pat. No. 10,587,090, it is referred to the safety features a being "inherent" indicating that they are designed to be self-contained with a closed loop and not needing to interact with external monitoring or computing devices. In an example, the source can be provided for specialized applications, among general applications, and the like.

U.S. Ser. No. 10/408,413B2 discloses a lighting device having at least one light sensor. The lighting device, comprising two or more light sources for emitting a polarized primary light beam (P), a phosphor volume for at least partly converting primary light of the primary light beam (P) into secondary light (S) having a different wavelength, which is arranged in a path of at least one primary light beam (P), a focusing lens to focus the polarized primary light beam (P) from the two or more light sources onto the phosphor volume, and the at least one light sensor arranged at least in a part of an original path of the primary light beam (P) downstream of the location of the phosphor volume, wherein the light sensor is sensitive at least to the primary light and is polarization-sensitive.

SUMMARY OF THE INVENTION

Products using laser lighting may need failure protection measures, to keep them safe to the user even in case failures in the system occurs. Existing products on the market that could lead to unsafe high laser light intensities upon failure, such as laser projectors, could e.g. be equipped with safety protections based on optical sensors and "tampering-detection" means such as interlocks and safety switches. Such sensors for example may detect the amount of laser light and the amount of converted light and when this ratio changes, or when the intensity increases above a certain threshold this is an indication of a problem in the system. Also, combinations of both optical and electrical sensors may be used in which driving currents and expected optical outputs are being compared, and in case of unexpected values a system-shutdown is forced. The sensor(s) may be connected to a control unit, which will switch off the laser power when the problem is detected, thereby preventing that users will be directly exposed to high intensities of laser light. Hence, in such embodiments of sensor circuits for failure detection, there is an additional circuitry needed for sensors and control units to control the laser light output. These systems need to be very accurate, and very sensitive, as they safeguard the safety (and classification) of the system. These extra controls add extra complexity to the system, and in some cases lead to "false-tripping", which means that the laser system is switched off by the protection circuitry, while there is no actual problem with the laser system. In case of a system failure, it is desirable to prevent laser light from escaping the system, thus creating the possibility of exposing people to direct laser light. An possible system failure mode appears to be the damaging or disappearance of the phosphor, caused by thermal-mechanical stresses. When this happens, the reflection of the (blue) pump laser from the wavelength converter unit, back into the system, may increase and this might lead to damage or in the worst case to emission of laser light into the ambient. Other failure modes may involve optical components, such as lenses and beam splitters, that break or crack under thermo-mechanical stresses. This may go with increased light scattering and changes in the laser beam path.

Hence, it is an aspect of the invention to provide an alternative light generating system, which preferably further at least partly obviates one or more of above-described drawbacks. The present invention may have as object to overcome or ameliorate at least one of the disadvantages of the prior art, or to provide a useful alternative.

In a first aspect, the invention provides a light generating system comprising a light source, such as a solid state light source, a luminescent material element, a sensor element, and an electrical circuit. Especially, in embodiments the (solid state) light source is configured to generate light source light, wherein the (solid state) light source is functionally coupled to the electrical circuit. Further, in embodiments the luminescent material element comprises a luminescent material, wherein the luminescent material element is configured in a light receiving relationship with the (solid state) light source. Especially, in embodiments the luminescent material is configured to convert at least part of the light source light into luminescent material light. Further, in embodiments the sensor element may comprise a sensor component. In embodiment, the sensor element may be comprised by the electrical circuit. Further, especially in embodiments the sensor component comprises a photo-resistor. In embodiments, the photo-resistor may have a variable resistance dependent on an extend of exposure to a light selected from the group consisting of the laser light and the luminescent material light. Hence, especially in embodiments the invention provides a light generating system comprising a solid state light source, a luminescent material element, a sensor element, and an electrical circuit, wherein: (a) the solid state light source is configured to generate light source light, wherein the solid state light source is functionally coupled to the electrical circuit; (b) the luminescent material element comprises a luminescent material, wherein the luminescent material element is configured in a light receiving relationship with the solid state light source, and wherein the luminescent material is configured to convert at least part of the light source light into luminescent material light; and (c) the sensor element comprises a sensor component, wherein the sensor element is comprised by the electrical circuit, wherein the sensor component comprises a photo-resistor, wherein the photo-resistor has a variable resistance dependent on an extend of exposure to a light selected from the group consisting of the laser light and the luminescent material light.

The current invention provides a simple and safe laser-phosphor based light generating system.

The current invention provides relatively simple configurations to lower or block the laser light output directly in the electrical circuit upon system failure, without the need of sensors and controls and acting essentially only in case of a real system failure, thus reducing the change of "false-tripping" of the laser-safety switch-off system.

As indicated above, in embodiments the light generating system comprises a (solid state) light source, a luminescent material element, a sensor element, and an electrical circuit.

The term "light source" may in principle relate to any light source known in the art. It may be a conventional (tungsten) light bulb, a low pressure mercury lamp, a high pressure mercury lamp, a fluorescent lamp, a LED (light emissive diode). In a specific embodiment, the light source comprises a solid state LED light source (such as a LED or laser diode (or "diode laser")). The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light semiconductor light source may be configured on the same substrate. In embodiments, a COB is a multi LED chip configured together as a single lighting module. The light source may have a light escape surface. Referring to conventional light sources such as light bulbs or fluorescent lamps, it may be outer surface of the glass or quartz envelope. For LED's it may for instance be the LED die, or when a resin is applied to the LED die, the outer surface of the resin. In principle, it may also be the terminal end of a fiber. The term escape surface especially relates to that part of the light source, where the light actually leaves or escapes from the light source. The light source is configured to provide a beam of light. This beam of light (thus) escapes form the light exit surface of the light source. The term "light source" may refer to a semiconductor light-emitting device, such as a light emitting diode (LEDs), a resonant cavity light emitting diode (RCLED), a vertical cavity laser diode (VC-SELs), an edge emitting laser, etc. . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The terms "light source" or "solid state light source" may also refer to a superluminescent diode (SLED). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). In embodiments, the light source may be configured to provide primary radiation, which is used as such, such as e.g. a blue light source, like a blue LED, or a green light source, such as a green LED, and a red light source, such as a red LED. In other embodiments, however, the light source may be configured to provide primary radiation and part of the primary radiation is converted into secondary radiation. Secondary radiation may be based on conversion by a luminescent material. The secondary radiation may therefore also be indicated as luminescent material radiation. The luminescent material may in embodiments be comprised by the light source, such as a LED with a luminescent material layer or dome comprising luminescent material. In other embodiments, the luminescent material may be configured at some distance ("remote") from the light source, such as a LED with a luminescent material layer not in physical contact with a die of the LED. Hence, in specific embodiments the light source may be a light source that during operation emits at least light at wavelength selected from the range of 380-470 nm. However, other wavelengths may also be possible. This light may partially be used by the luminescent material. In embodiments, the light source may be selected from the group of laser diodes and superluminescent LEDs.

The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser. In specific embodiments, the terms "laser" or "laser light source", or similar terms, refer to a laser diode (or diode laser).

Hence, in embodiments the light source comprises a laser light source. In embodiments, the terms "laser" or "solid state laser" may refer to one or more of cerium doped lithium strontium (or calcium) aluminum fluoride (Ce:

LiSAF, Ce:LiCAF), chromium doped chrysoberyl (alexandrite) laser, chromium ZnSe (Cr:ZnSe) laser, divalent samarium doped calcium fluoride (Sm:CaF$_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate Nd:YCa$_4$O(BO$_3$)$_3$ or Nd:YCOB, neodymium doped yttrium orthovanadate (Nd:YVO$_4$) laser, neodymium glass (Nd:glass) laser, neodymium YLF (Nd:YLF) solid-state laser, promethium 147 doped phosphate glass (147Pm$^{3+}$:glass) solid-state laser, ruby laser (Al$_2$O$_3$:Cr$^{3+}$), thulium YAG (Tm:YAG) laser, titanium sapphire (Ti:sapphire; Al$_2$O$_3$:Ti$^{3+}$) laser, trivalent uranium doped calcium fluoride (U:CaF$_2$) solid-state laser, Ytterbium doped glass laser (rod, plate/chip, and fiber), Ytterbium YAG (Yb:YAG) laser, Yb$_2$O$_3$ (glass or ceramics) laser, etc.

In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

A laser may be combined with an upconverter in order to arrive at shorter (laser) wavelengths. For instance, with some (trivalent) rare earth ions upconversion may be obtained or with non-linear crystals upconversion can be obtained. Alternatively, a laser can be combined with a downconverter, such as a dye laser, to arrive at longer (laser) wavelengths.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light.

The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

As indicated above, the (solid state) light source is configured to generate light source light. In embodiments, this may be one or more of UV and blue light.

In specific embodiments, the (solid state) light source is functionally coupled to the electrical circuit. Hence, especially, the (solid state) light source is comprised in the electrical circuit.

The luminescent material element especially comprises a luminescent material. The luminescent element may comprise one or more of a layer and a body. The body may be self-supporting, though this is not necessarily the case. The luminescent element may comprise a host material, like a polymeric material or a ceramic material, etc., wherein the luminescent material is embedded in. The luminescent element may also be a layer or body of luminescent material, like for instance a luminescent ceramic.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion.

In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} < \lambda_{em}$), though in specific embodiments the luminescent material may comprise up-converter luminescent material, i.e. radiation of a larger wavelength is converted into radiation with a smaller wavelength ($\lambda_{ex} > \lambda_{em}$).

In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. Examples of possible luminescent materials are indicated below.

In embodiments, luminescent materials are selected from garnets and nitrides, especially doped with trivalent cerium or divalent europium, respectively. The term "nitride" may also refer to oxynitride or nitridosilicate, etc.

In specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein x1+x2+x3=1, wherein x3>0, wherein 0<x2+x3<0.2, wherein y1+y2=1, wherein 0<y2<0.2, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially x1>0, such as >0.2, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein 0<x2+x3≤0.1, and wherein 0≤y2≤0.1. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein x1+x3=1, and wherein 0<x3≤0.2, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein x1+x2+x3=1, wherein x3>0, wherein 0<x2+x3<0.2, wherein y1+y2=1, wherein 0≤y2≤0.2. Especially, x3 is selected from the range of 0.001-0.1. Note that in embodiments x2=0. Alternatively or additionally, in embodiments y2=0.

In specific embodiments, A may especially comprise at least Y, and B may especially comprise at least Al.

In embodiments, the luminescent material may alternatively or additionally comprise one or more of $M_2Si_5N_8$:$Eu^{2+}$ and/or $MAlSiN_3$:$Eu^{2+}$ and/or $Ca_2AlSi_3O_2N_5$:$Eu^{2+}$, etc., wherein M comprises one or more of Ba, Sr and Ca, especially in embodiments at least Sr. Hence, in embodiments, the luminescent may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu 2+). For instance, assuming 2% Eu in CaAlSiN$_3$:Eu, the correct formula could be $(Ca_{0.98}Eu_{0.02})$ AlSiN$_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca). Likewise, the material (Ba,Sr,Ca)AlSiN$_3$: Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

In embodiments, a red luminescent material may comprise one or more materials selected from the group consisting of (Ba,Sr,Ca)S:Eu, (Ba,Sr,Ca)AlSiN$_3$:Eu and (Ba,Sr, Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Eu in the above indicated luminescent materials is substantially or only in the divalent state, as is known to the person skilled in the art.

Blue luminescent materials may comprise YSO (Y$_2$SiO$_5$: Ce$^{3+}$), or similar compounds, or BAM (BaMgAl$_{10}$O$_{17}$: Eu$^{2+}$), or similar compounds.

The term "luminescent material" herein especially relates to inorganic luminescent materials.

Instead of the term "luminescent material" also the term "phosphor". These terms are known to the person skilled in the art.

Alternatively or additionally, also other luminescent materials may be applied. For instance quantum dots and/or organic dyes may be applied and may optionally be embedded in transmissive matrices like e.g. polymers, like PMMA, or polysiloxanes, etc. etc.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide (CuInS$_2$) and/or silver indium sulfide (AgInS$_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Different luminescent materials may have different spectral power distributions of the respective luminescent material light. Alternatively or additionally, such different luminescent materials may especially have different color points (or dominant wavelengths).

As indicated above, other luminescent materials may also be possible. Hence, in specific embodiments the luminescent material is selected from the group of divalent europium containing nitrides, divalent europium containing oxynitrides, divalent europium containing silicates, cerium comprising garnets, and quantum structures. Quantum structures may e.g. comprise quantum dots or quantum rods (or other quantum type particles) (see above). Quantum structures may also comprise quantum wells. Quantum structures may also comprise photonic crystals.

In specific embodiments, the luminescent material may be configured to convert at least part of the (solid state) light source light into luminescent material light having one or more wavelengths in one or more of the green, yellow, orange, and red. However, alternatively or additionally, the luminescent material may be configured to convert at least part of the (solid state) light source light into luminescent material light having one or more wavelengths in the infrared.

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The term "cyan" may refer to one or more wavelengths selected from the range of about 490-520 nm. The term "amber" may refer to one or more wavelengths selected from the range of about 585-605 nm, such as about 590-600 nm.

Herein, UV (ultraviolet) may especially refer to a wavelength selected from the range of 190-380 nm, though in specific embodiments other wavelengths may also be possible.

Herein, IR (infrared) may especially refer to radiation having a wavelength selected from the range of 780-3000 nm, such as 780-2000 nm, e.g. a wavelength up to about 1500 nm, like a wavelength of at least 900 nm, though in specific embodiments other wavelengths may also be possible. Hence, the term IR may herein refer to one or more of near infrared (NIR (or IR-A)) and short-wavelength infrared (SWIR (or IR-B)), especially NIR.

As indicated above, the luminescent material element may especially be configured in a light receiving relationship with the (solid state) light source. Further, especially the luminescent material is configured to convert at least part of the light source light into luminescent material light. Hence, the luminescent material may be configured downstream of the (solid state) light source.

The terms "radiationally coupled" or "optically coupled" may especially mean that (i) a light generating element, such as a light source, and (ii) another item or material, are associated with each other so that at least part of the radiation emitted by the light generating element is received by the item or material. In other words, the item or material is configured in a light-receiving relationship with the light generating element. At least part of the radiation of the light generating element will be received by the item or material. This may in embodiments be directly, such as the item or material in physical contact with the (light emitting surface of the) light generating element. This may in embodiments be via a medium, like air, a gas, or a liquid or solid light guiding material. In embodiments, also one or more optics, like a lens, a reflector, an optical filter, may be configured in the optical path between light generating element and item or material. The term "in a light-receiving relationship" does, as indicated above, not exclude the presence of intermediate optical elements, such as lenses, collimators, reflectors, dichroic mirrors, etc. In embodiments, the term "light-receiving relationship" and "downstream" may essentially be synonyms.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

In specific embodiments, the light source light, such as laser light, may be directed at the luminescent material element such that specular reflection of the light source light at the luminescent material element will essentially not propagate together with the luminescent material light to an end window of the system. For instance, in embodiments an end window (or light exit window) of the system may be configured under e.g. an angle of 90° relative to the luminescent material light propagating to the end window. For instance, an optical axis of the light source light (just) upstream of the luminescent material element and the direction of the luminescent material light propagating from the luminescent material element to the end window may define an angle α selected from the range of 20-160°, like selected from the range of 35-145°.

Further, the lighting system may especially comprise a sensor component. Especially, the sensor element may be comprised by the electrical circuit.

In embodiments, the electrical circuit may be configured such that in dependence of an electrical resistance of the sensor component, electrical power provided to the laser via the electrical circuit is controlled.

In specific embodiments, the sensor element may comprise a sensor component selected from the group comprising (i) a radiation sensitive component and (ii) a heat sensitive component.

Further, in specific embodiments, the sensor element may be configured in a configuration selected from the group comprising: (a) in a light receiving relationship with the luminescent material; (b) in a light receiving relationship with the laser; and (c) in a heat receiving relationship with the luminescent material.

Especially, in embodiments one or more of (i) an intensity of the luminescent material light received by the sensor element, (ii) an intensity of the laser light received by the sensor element, and (iii) heat sensed by the sensor element, may be dependent on a presence and absence of at least a predetermined part of a functional component in the light generating system, wherein the functional component is selected from the group comprising the luminescent material element and an optical component.

In specific embodiments, the sensor element may comprise a sensor component, wherein the sensor component is comprised by the electrical circuit.

Especially, in embodiments the sensor component may comprise one or more of (a) a photo-resistor configured in a light receiving relationship with light selected from the group of laser light and luminescent material light, wherein the photo-resistor has a variable resistance dependent on an extend of exposure to the light; and, (b) a thermo-resistor configured in a heat receiving relationship with a functional component comprised by the light generating system, wherein the thermo-resistor has a variable resistance dependent on a extend of heat received.

In specific embodiments, the sensor component may comprise one or more of a negative temperature coefficient resistor, a positive temperature coefficient resistor, a light dependent resistor, and a bimetallic switch. Further, especially the sensor component may be configured to increase or decrease its resistance in the electrical circuit in dependence of one or more of the extend of exposure to the light and the extend of heat received.

Hence, in an aspect the invention provides a light generating system comprising a solid state light source, a luminescent material element, a sensor element, and an electrical circuit, wherein: (a) the solid state light source is configured to generate light source light, wherein the solid state light source is functionally coupled to the electrical circuit; (b) the luminescent material element comprises a luminescent material, wherein the luminescent material element is configured in a light receiving relationship with the solid state light source, and wherein the luminescent material is configured to convert at least part of the light source light into luminescent material light; and (c) the sensor element comprises a sensor component, wherein the sensor element is comprised by the electrical circuit, wherein the sensor component comprises a thermo-resistor, wherein the thermo-resistor has a variable resistance dependent on an extend of exposure to heat induced (in e.g. a functional component) by one or more of the laser light, the luminescent material light, and heat generated in the luminescent material element (due to conversion of light source light into luminescent material light).

Especially, such system may further comprise a switch (or "switching element), which may prevent providing power to the light source after the power to the light source has been reduced due to a resistance change of the sensor component (such as one or more of an photo-resistor and thermo-resistor) as described herein, unless e.g. a reset is executed.

Hence, in specific embodiments the sensor component may comprise a photo-resistor configured in a light receiving relationship with light selected from the group of laser light and luminescent material light, wherein the photo-resistor has a variable resistance dependent on an extend of exposure to the light. Yet, in specific embodiments the sensor component comprises a photo-resistor, wherein the photo-resistor has a variable resistance dependent on an extend of exposure to a light selected from the group consisting of the laser light and the luminescent material light.

For instance, this may imply that when the system is operation properly, the sensor component does not receive light, such as solid state light source light or luminescent material light. However, when a functional component, such as the luminescent element or an optical element is damaged, or broken, or at least partly removed, the sensor component may receive light. Then, the resistance may change.

For instance, this may alternatively (or additionally) imply that when the system is operation properly, the sensor component receives light, such as solid state light source light or luminescent material light. However, when a functional component, such as the luminescent element or an optical element is damaged, or broken, or at least partly removed, the sensor component may not receive the light anymore, or a with a reduced intensity. Then, the resistance may change.

For instance, this may alternatively (or additionally) imply that when the system is operation properly, the sensor component receives light, such as solid state light source light or luminescent material light. However, when a functional component, such as the luminescent element or an optical element is damaged, or broken, or at least partly removed, the sensor component may receive the light with an increased intensity. Then, the resistance may change. Hence, as indicated above, in embodiments one or more of (i) an intensity of the luminescent material light received by the sensor element, and (ii) an intensity of the laser light received by the sensor element, may be dependent on a presence and absence of at least a predetermined part of a functional component in the light generating system.

Therefore, especially in embodiments the lighting system may comprise a sensor component, wherein the sensor element is comprised by the electrical circuit, wherein the sensor component comprises a photo-resistor, and wherein the photo-resistor has a variable resistance dependent on an extend of exposure to a light selected from the group consisting of the laser light and the luminescent material light.

Especially, in embodiments the sensor component may be configured to increase or decrease its resistance in the electrical circuit in dependence of one or more of the extend of exposure to the light and the extend of heat received.

In specific embodiments, the photo-resistor may be configured in a beam dump. In specific embodiments, the beam dump may be a recess or cavity. Especially, in embodiments the beam dump may comprise a light absorbing material for the laser light, such as a black material (like a material with a black coating). This may improve the safety. Hence, in specific embodiments the photo-resistor may be configured in a recess or cavity of a beam dump.

Especially, in embodiments the luminescent material element is configured remote from the solid state light source. Herein, the term "remote" may refer to a distance of the luminescent material element from a light emitting surface, such as a die, from a solid state light source which is such, that there is essentially not physical contact. Further, there may also essentially be not thermal contact. Hence, the minimum distance may be about the wavelength of interest, such as the centroid wavelength of the light source light or the centroid wavelength of the luminescent material light, especially at least the larger of the two. The wavelength of interest may especially be the centroid wavelength of the luminescence of the luminescent material.

The term "centroid wavelength", also indicated as $\lambda c$, is known in the art, and refers to the wavelength value where half of the light energy is at shorter and half the energy is at longer wavelengths; the value is stated in nanometers (nm). It is the wavelength that divides the integral of a spectral power distribution into two equal parts as expressed by the formula $\lambda c = \Sigma \lambda * I(\lambda)/(\Sigma I(\lambda))$, where the summation is over the wavelength range of interest, and I(2) is the spectral energy density (i.e. the integration of the product of the wavelength and the intensity over the emission band normalized to the integrated intensity). The centroid wavelength may e.g. be determined at operation conditions.

When the luminescent material is remote, the luminescent element and the light source light may be thermally decoupled. However, this is not necessarily the case. Further, with a remote configuration of the luminescent material, heat management of the luminescent element may be relatively more easy.

In specific embodiments, however, the luminescent material element may be in physical contact with a light emitting surface of the (solid state) light source.

As indicated above, in specific embodiments the solid state light source comprises one or more of a laser diode and a superluminescent diode. Especially, the solid state light source may comprise a laser diode, which may have a more narrow emission band than a superluminescent diode.

In specific embodiments, the sensor component may be configured to decrease resistance upon increased intensity of the light source light. Especially, in such embodiments the sensor component may be configured in parallel with the solid state light source.

In specific embodiments, the sensor component may be configured to increase resistance upon increased intensity of the light source light. Especially, in such embodiments the sensor component is configured in series with the solid state light source.

The system may also comprise a plurality of sensor components. In this way there may be safety precautions for different failure possibilities.

In specific embodiments, the luminescent material element may be configured in a transmissive mode, and the sensor component is configured downstream of the luminescent material element.

In an alternative embodiment, the luminescent material element may be configured in a reflective mode. Especially then in embodiments the following may apply: (i) the sensor component may be configured downstream of the luminescent material element and may be configured to receive at least part of the light source light reflected at the luminescent material element, or (ii) the sensor component may be configured to receive light source light in the absence of a predetermined part of the luminescent material element and may be configured to receive no or a reduced intensity of the light source light in the presence of the predetermined part of the luminescent material element.

For instance, assume a hole in the luminescent element, then (solid state) light source light may propagate through the hole and reach a sensor component. However, in embodiments there may also be a reflective layer behind the luminescent element. In such embodiments, reflection of the (solid state) light source light may become stronger when there is a hole. The change in reflection may lead to a change in resistance of a sensor component. Further, dependent upon the angle of a sensor component relative to the luminescent element, a hole may induce a higher intensity of the laser light or luminescent material light on the sensor due to reflection at the luminescent element.

In specific embodiments, the sensor component may be configured to decrease resistance upon increased intensity of the luminescent material light, wherein the sensor component may be configured in series with the solid state light source.

In specific embodiments, the sensor component may be configured to increase resistance upon increased intensity of the luminescent material light, wherein the sensor component is configured in parallel with the solid state light source.

In specific embodiments, the sensor component may be configured to receive stray light of one or more of the solid state light source and the luminescent material. In alternative embodiments, part of the luminescent material light may be guided away from a main beam, and directed to the sensor component.

As indicated above, the system may also comprise a plurality of sensor components. In this way there may be safety precautions for different failure possibilities.

In specific embodiments, the functional component may comprise the luminescent element, wherein the sensor component may comprise the thermo-resistor, and wherein the sensor component may be thermally coupled to the luminescent element. In (other) specific embodiments, the functional component may comprise an optical component, wherein the sensor component comprises the thermo-resistor, and wherein the sensor component may be thermally coupled to the optical component. Especially, in embodiments the sensor component may be configured to decrease resistance upon increased heat received, wherein the sensor component may be configured in series with the solid state light source or wherein the sensor component may be configured to increase resistance upon increased heat received, wherein the sensor component is configured in parallel with the solid state light source.

In embodiments, the sensor component may be configured to change resistance irreversibly. Would for instance due to further or other damage of the phosphor and/or a further or other damage of (another) optical component a reversible resistance of a sensor component by accidence lead to an increase of power to the solid state light source, this may be undesirable. Hence, the change in resistance may be irreversible. For instance, it may be necessary to replace the sensor component (and the possibly damages functional component).

In embodiments, the power the (solid state) light source receives may be reduced. However, in other embodiments the power the (solid state) light source receives may be switched off. Hence, in specific embodiments the electrical circuit may be configured such that in dependence of the electrical resistance of the sensor component, the sensor element terminates the electrical power provided to the solid state light source via the electrical circuit. For instance, in embodiments the light generating system may further comprise a circuit component selected from the group comprising a relay and a solid state switch, wherein the circuit component is configured such that in dependence of the electrical resistance of the sensor component, the circuit component terminates the electrical power provided to the solid state light source via the electrical circuit. The solid state switch may comprise a MOSFET switch or another semiconductor switch-like device. Especially, the circuit component may comprise such semiconductor switch-like device like a MOSFET.

In specific embodiments, the system may comprise a control unit configured to prevent that the solid state light source switches automatically on again after an occurrence wherein the sensor element has terminated providing the electrical power to the solid state light source. Especially, this control unit may not necessarily be software based, but may essentially be based on electrical components, including hardware switches.

As indicated above, the system may comprise a plurality of sensor elements configured at different positions within the light generating system. This may further enhance safety.

In an operational mode, the system may be configured to generate white system light. In yet other embodiments, in an (other) operational mode, the system may be configured to generate colored light. In yet other embodiments, in (yet) an (other) operational mode, the system may be configured to generate infrared radiation.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

The terms "visible", "visible light" or "visible emission" and similar terms refer to light having one or more wavelengths in the range of about 380-780 nm. Herein, UV may especially refer to a wavelength selected from the range of 200-380 nm.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

The light generating system may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting. The light generating system (or luminaire) may be part of or may be applied in e.g. optical communication systems or disinfection systems.

In yet a further aspect, the invention also provides a lamp or a luminaire comprising the light generating system as defined herein. The luminaire may further comprise a housing, optical elements, louvres, etc. etc. . . . . The lamp or luminaire may further comprise a housing enclosing the light generating system. The lamp or luminaire may comprise a light window in the housing or a housing opening, through which the system light may escape from the housing. In yet a further aspect, the invention also provides a projection device comprising the light generating system as defined herein. Especially, a projection device or "projector" or "image projector" may be an optical device that projects an image (or moving images) onto a surface, such as e.g. a projection screen. The projection device may include one or more light generating systems such as described herein. Hence, in an aspect the invention also provides a light generating device selected from the group of a lamp, a luminaire, a projector device, a disinfection device, and an optical wireless communication device, comprising the light generating system as defined herein.

In embodiments, (i) the sensor component may be configured to decrease resistance upon increased intensity of the light source light, wherein the sensor component is configured in parallel with the solid state light source; (ii) the sensor component may be configured to increase resistance upon increased intensity of the light source light, wherein the sensor component is configured in series with the solid state light source; (iii) the sensor component may be configured to decrease resistance upon increased intensity of the luminescent material light, wherein the sensor component is configured in series with the solid state light source; and/or (iv) the sensor component may be configured to increase resistance upon increased intensity of the luminescent material light, wherein the sensor component is configured in parallel with the solid state light source.

In embodiments, the light source may comprise a laser light source, and wherein the electrical circuit is configured such that a change in resistance of the photoresistor leads to a lowering of the current and/or voltage to the laser light source and thus dimming down or shutting off the laser light source.

In embodiments, one or more of (i) an intensity of the luminescent material light received by the sensor element, and (ii) an intensity of the laser light received by the sensor element, may depend on a presence and absence of at least a predetermined part of a functional component in the light generating system, wherein the functional component is selected from the group comprising the luminescent material element and an optical component.

In embodiments, when (iii) the sensor component may be configured to decrease resistance upon increased intensity of the luminescent material light, and wherein the sensor component is configured in series with the solid state light source, then the sensor component is also configured to increase resistance upon decreased intensity of the luminescent material light; and/or when (iv) the sensor component may be configured to increase resistance upon increased intensity of the luminescent material light, and wherein the sensor component is configured in parallel with the solid state light source, then the sensor component is configured to decrease resistance upon decreased intensity of the luminescent material light.

In embodiments, the sensor component may be configured to change resistance reversibly.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
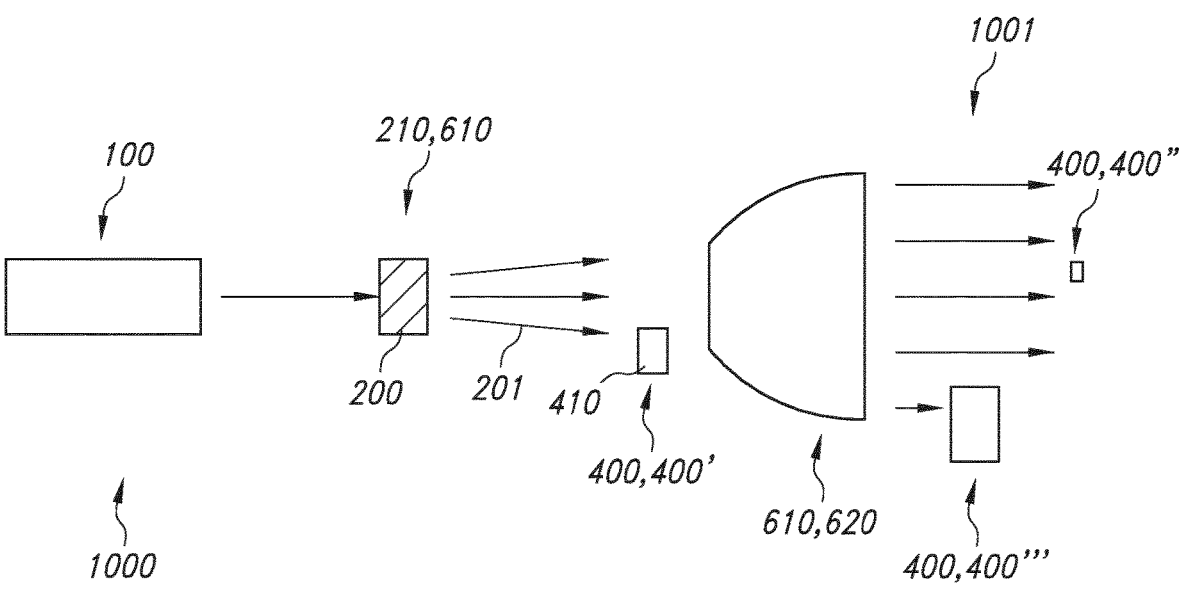
FIGS. 1a-1b schematically depict some aspects.
Figure 1B:
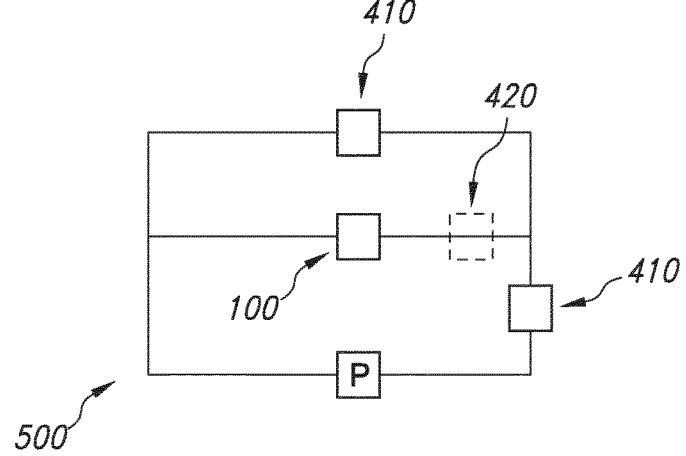

FIG. 1a schematically depict an embodiment of the system 1000. FIG. 1b schematically depicts a circuit 500, with a number of variants. The system 1000 and circuit 500 will further be discussed below.

FIG. 1a schematically depicts an embodiment of the light generating system 1000. The system 1000 comprises a solid state light source 100, a luminescent material element 210, a sensor element 400, and an electrical circuit 500. The solid state light source 100 comprises one or more of a laser diode and a superluminescent diode. Other light sources than solid state light source may in embodiments also be possible.

The solid state light source 100 is configured to generate light source light 101, wherein the solid state light source 100 is functionally coupled to the electrical circuit 500.

The luminescent material element 210 comprises a luminescent material 200. The luminescent material element 210 is configured in a light receiving relationship with the solid state light source 100. The luminescent material 200 is configured to convert at least part of the light source light 101 into luminescent material light 201.

The system 1000 is configured to generate system light 1001 during an operational mode. Especially, during the operational mode the system light 1001 comprises the luminescent material light 201.

The sensor element 400 may comprise a sensor component 410. The sensor element 400 is comprised by the electrical circuit 500. The sensor component 410 may comprise a photo-resistor. The photo-resistor has a variable resistance dependent on an extend of exposure to a light 11 selected from the group consisting of the laser light 100 and the luminescent material light 201.

As schematically depicted, the luminescent material element 210 may be configured remote from the solid state light source 100.

The sensor component 410 may be configured to increase or decrease its resistance in the electrical circuit 500 in dependence of one or more of the extend of exposure to the light 11 and the extend of heat received.

Referring to especially FIG. 1b, in embodiments the sensor component 410 may be configured to decrease resistance upon increased intensity of the light source light 101, wherein the sensor component is configured in parallel with the solid state light source 100. In embodiments the sensor component 410 may be configured to increase resistance upon increased intensity of the light source light 101, wherein the sensor component is configured in series with the solid state light source 100.

Referring to FIG. 1a, the luminescent material element 210 is configured in a transmissive mode. In such embodiments, the sensor component 410 may be configured downstream of the luminescent material element 210.

Alternatively, in embodiments the luminescent material element 210 is configured in a reflective mode. In such embodiments, the following may apply: (i) the sensor component 410 is configured downstream of the luminescent material element 210 and is configured to receive at least part of the light source light 101 reflected at the luminescent material element 210, or (ii) the sensor component 410 may be configured to receive light source light 101 in the absence of a predetermined part of the luminescent material element 210 and is configured to receive no or a reduced intensity of the light source light 101 in the presence of the predetermined part of the luminescent material element 210.

In embodiments, the sensor component may be configured to decrease resistance upon increased intensity of the luminescent material light, wherein the sensor component is configured in series with the solid state light source. In other embodiments, the sensor component may be configured to increase resistance upon increased intensity of the luminescent material light, wherein the sensor component is configured in parallel with the solid state light source. For instance, this may be the case when the luminescent material is operated in the reflective mode, and the sensor component is configured behind the luminescent material element, and may only receive laser light, or increased laser light intensity, when the luminescent material element may be damaged.

In embodiments, the sensor component may be configured to receive stray light of one or more of the solid state light source and the luminescent material.

In embodiments, the sensor component 410 may be configured to change resistance irreversibly.

Referring to FIGS. 1a-1b, the light generating system 1000 may comprise a plurality of sensor elements 400 configured at different positions within the light generating system 1000.

Amongst others, the invention may provide in embodiments an electrical circuit with an element that changes resistance upon exposure to the laser (this can be a thermal or optical induced change). The element may be placed at such a location that it is not exposed under normal operation conditions, but that it will be exposed to direct laser light upon failure. In alternative configuration, the element can be placed such that under normal conditions it is exposed to converted laser light, and in case of failure it is not exposed. The circuit may be designed in such a way that the change in resistance leads to a lowering of the current and or voltage to the laser, which will then dim down or shut off, thereby preventing unsafe situations caused by non-controlled irradiation of high intensity laser light escaping from the system into the ambient.

In embodiments, an element may be used that decreases resistance upon exposure to the laser beam. Examples are a light dependent resistor (LDR) or a negative temperature coefficient resistor (NTC), which is placed in the optical path after an optical element such as a phosphor or a beam shaping lens or reflector. In the electrical circuit this component is connected parallel to the laser device(s).

Figure 2A:
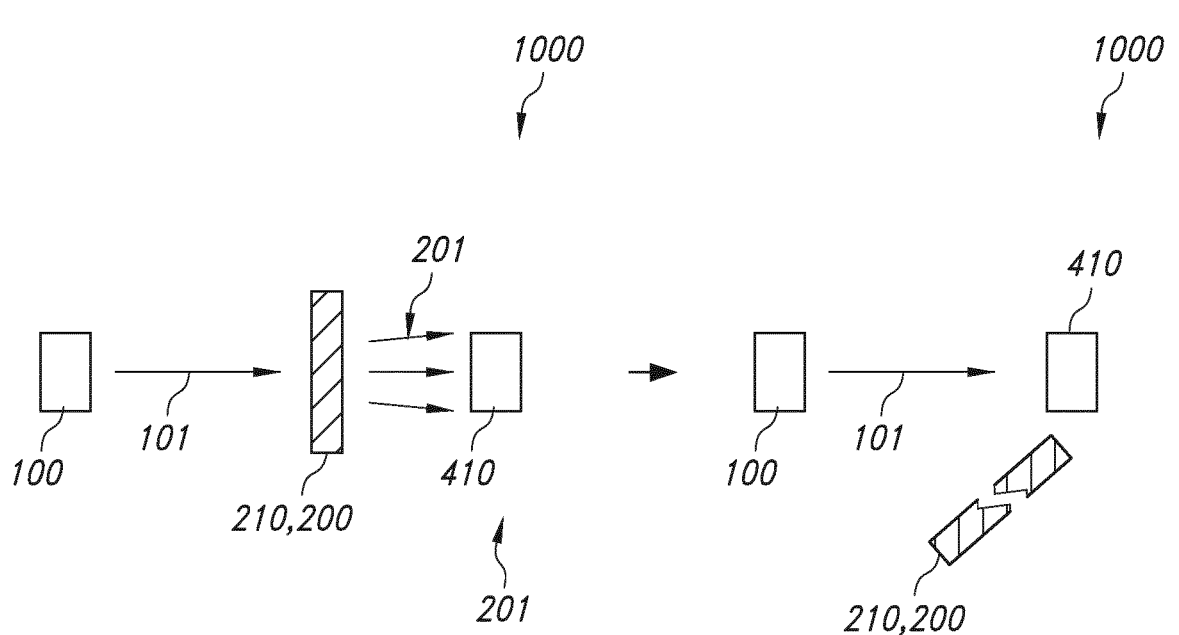
FIGS. 2a-2g schematically depict some embodiments and variants.

Referring to FIG. 2a, under normal operation this part of the circuit is exposed to a certain light intensity that does not affect the resistance and normal operation is achieved. When the optical element fails, as shown for the phosphor in the drawing (but the same holds for other optical elements in the system), the resistor may be exposed to direct laser light. In this case the resistance may drop, either due to light (LDR) or due to heating of the resistor (NTC).

When the resistance drops, more current will flow through the resistor part of the circuit and as a result the laser gets less current and power and will dim down or switch off when power is below threshold. For a 5 W blue laser, driven at 3.5 A and 4.5 V, the laser may operate in a normal way when R>50Ω and the laser is off when R<2Ω.

In embodiments of the configurations described, switching off the laser may be reversible: once the flux or temperature decreases the resistive element will increase its resistance again and the laser will switch back on. Therefore, in these configurations a control mechanism may be needed that prevents the laser from switching on again after it has been switched off. When this is not present, an oscillating behavior may occur: in case the laser dims or switches off the resistor is not exposed anymore so current increases and the laser will be powered again, when it powered the resistor is exposed again, etc. Such a control mechanism can be a simple feature that switches off the driver once the current drops below a certain level, and needs (manual) reset or switch on.

In (other) embodiments an element may be used that increases resistance upon exposure to the laser beam. Examples are a positive temperature coefficient resistor (PTC) or a bimetallic switch in thermal contact with e.g. the phosphor or the phosphor holder, which is placed in the optical path after an optical element such as a phosphor or a beam shaping lens or reflector. In the electrical circuit this component is in series with the laser device(s). The effect and laser dimming/switch off may be reversible, e.g. by increasing resistance of a PTC or opening of the circuit by a bimetallic switch: in these cases a control mechanism needs to be included to prevent the laser from switching on again (like described in the above embodiments).

Under normal operation this part of the circuit is exposed to a certain light intensity that does not affect the resistance and normal operation is achieved, similar to the situation described in above embodiments for the parallel circuit with a resistance decreasing element. When the optical element fails, as shown for the phosphor in the drawing (but the same holds for other optical elements in the system), the resistor or bimetallic switch is exposed to direct laser light. In this case the resistance increases or an open circuit is generated due to heating of the element.

When resistance increases the voltage drop over the resistor part of the circuit will increase and as a result the laser gets less voltage and power and will dim down or switch off when power is below threshold. For a 5 W blue laser, driven at 3.5 A and 4.5 V, the situation is as follows: the laser operates in a normal way when R<0.2Ω and the laser is off when R>1.2Ω.

With regards to the response speed of the device, it is noted that e.g. zero ohm resistors are sold in many form factors and sizes. Embodiments, could e.g. be to use a small SMT/SMD resistor, e.g. 0603: size is 1.55×0.85×0.28 mm=0.4 mm 3=~1 mg material. The specific heat capacity of materials is 0.1-1 J $g^{-1}K^{-1}$ for metals, 0.8-1 J $g^{-1}K^{-1}$ for glass an 2.2-2.5 J $g^{-1}K^{-1}$ for organic materials. Assume for the resistors worst case of 2.5 J $g^{-1}K^{-1}$=2.5*$10^{-3}$ J $g^{-1}K^{-1}$.

For a 3-5 W laser, all laser power will reach the resistor when the phosphor fails. Assuming a moderate 20-35% absorption in the resistor, this means 1 W power on the resistor. A 1 W power will increase 1 mg material 100 K in temperature within 0.25 seconds. When the absorbed power is 2 W and the specific resistance is 1.0 J $g^{-1}K^{-1}$ then the time to heat up 1 mg by 100 K is only 50 ms.

With regards to the reliability of the components and the method it is noted that SMT (surface mounted) and leaded resistors are standard components, used in PCB assemblies and lifetime/reliability of the components is in line with PCB quality requirements. The effect is also reliable: parts can be well aligned and positioned with respect to the (non-converted) laser beam, ensuring that the laser beam will heat the resistor. The properties of resistor depend on the type. Example of a Murata thermistor shows a resistance change of at least 2 orders of magnitude when heated from 20° C. (room temperature) to 120° C. Two order of magnitude is typically sufficient to switch off the laser power, and this is achievable within a 40° C. temperature increase.

As an extension to the examples described in some of the above embodiments, could be an irreversible change of resistance can be implemented by using sacrificial components, such as a fuse or 0Ω resistor, which will be damaged and cause an open circuit after direct exposure to the laser.

In general, if laser light is absorbed in a surface, a lot of heat can be locally generated. Therefore, a simple 0Ω fuse or wire can be placed in series with the current delivering circuit of the laser. In case of phosphor failure, or other failure at a critical position in the system (e.g. a beam diverting mirror that cracks), this "melting fuse" will be irradiated by the laser, heat-up and will melt, shutting down the laser before emission to the ambient occurs. This scheme can be applied throughout the optical path at critical locations that are susceptible for light emission into the ambient in case a certain component fails. As the open in the circuit is irreversible, no additional switches or electronics are needed to prevent the system from switching on again when it has cooled down.

In embodiments, a sacrificial resistor can be made of a thin layer of aluminum. A 35 μm thick layer of 300 μm wide and 10 mm long has a resistance of 25 mΩ. This may be low enough to achieve normal operation.

Upon failure the track is exposed to the non-converted laser light. For the estimate it is assumed that 1 W of power is absorbed for a 3-5 W laser source. Assuming a laser spot of 500 μm, an Al area of 300×500 μm is exposed, which is 0.014 mg Al. The specific heat capacity of aluminum is 0.897 J $g^{-1}K^{-1}$, which means it may take 13 ms to heat op 0.014 mg Al by 1000 K. This may be sufficient to melt the Al (melting point 933 K) and open the circuit. When the Al track is 70 μm thick and 500 μm wide, initial resistance is 8 mΩ and the time needed to heat a spot by 1000 K is 43 ms.

Figure 2B:
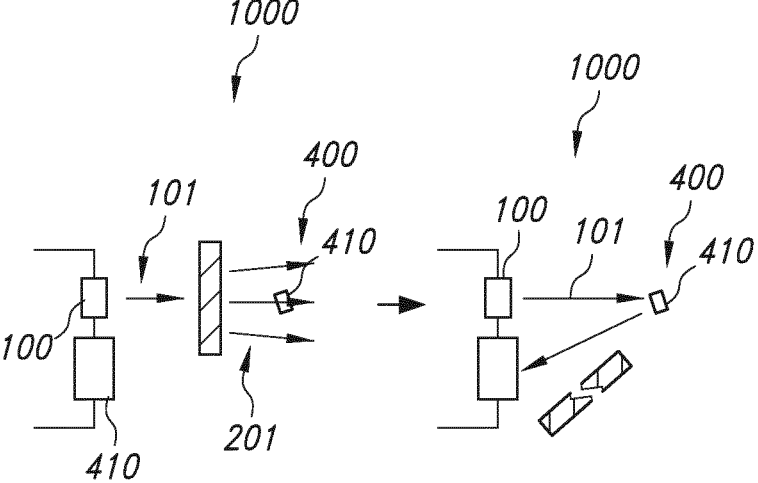

In the embodiments described above the resistance changing element is placed in the optical path after one or more of the optical component. Alternatively, the resistance changing element may be placed adjacent to the laser in combination with a reflective element after the optical element. Advantages are further simplification of the electrical layout, and absence of an electrical element in the light path. See also FIG. 2b.

In another configuration, a resistance changing element which decreases resistance upon exposure to light (for example a LDR) is placed in series with the laser light source. In the example described here, the resistive element is exposed to the converted light from the phosphor. Alternatively, this element can be exposed to redistributed laser or converted light after one of the optical elements in the system.

Under normal operation, the resistance changing element is exposed to converted light, and as a consequence the resistance is low. When the phosphor is damaged, no converted light reaches the resistive element, the resistance will increase and as a consequence the voltage over the laser will drop and the laser will dim or switch off.

Figure 2C:
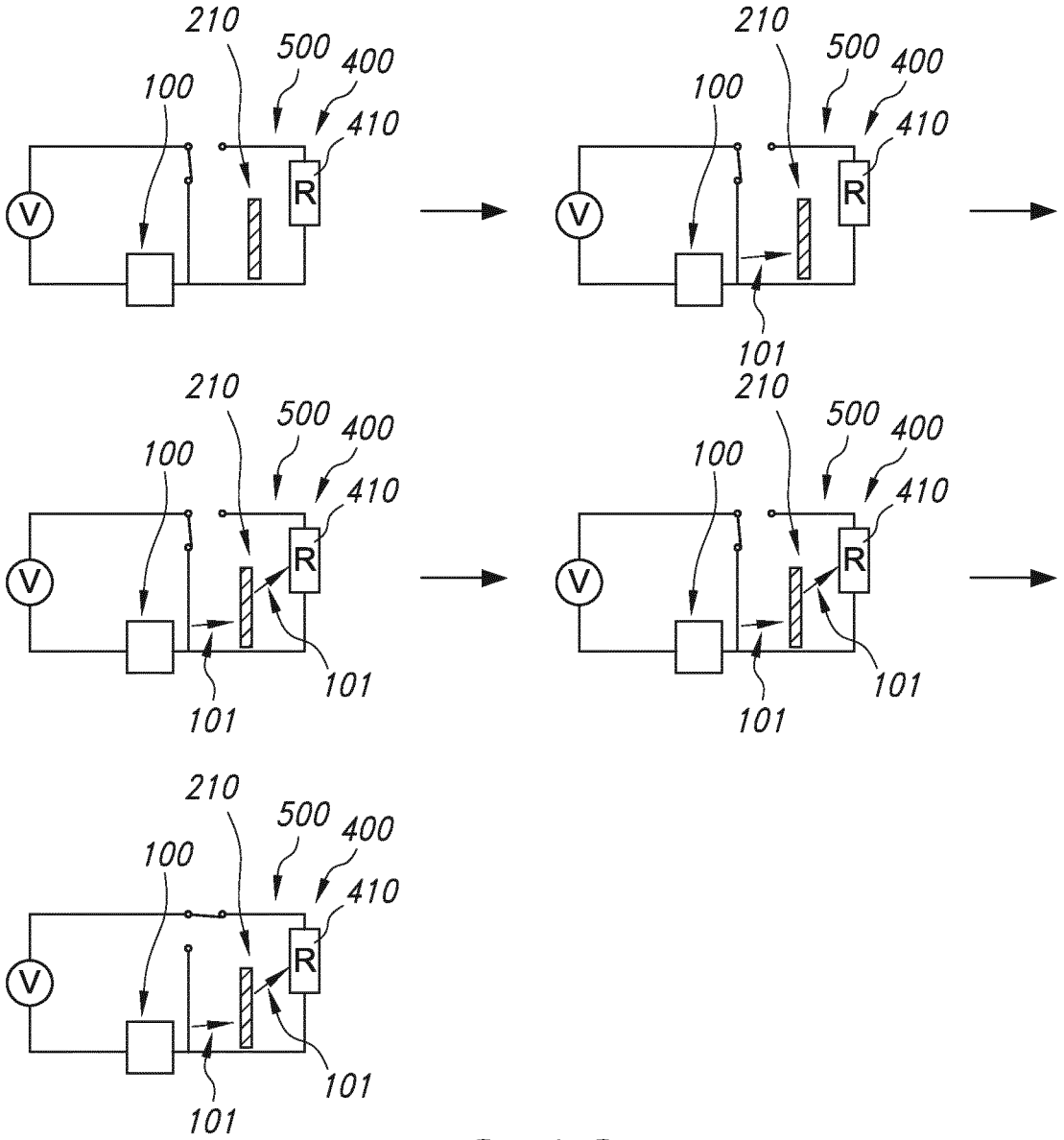

It is beneficial to have an additional switching element in the circuit, to facilitate startup of the laser, as the resistive element at start up still has a high resistance value. At start up the switch will be set to position 1, to connect the laser directly to the power supply. When light is emitted, converted light is generated and the resistance value of R decreases, the switch will move to position 2 connecting the laser and resistor in series to the power supply. See also FIG. 2c. In case of failure no converted light reaches the resistive element, resistance will rise and the voltage over the laser will drop. This leads to dimming or complete switch off of the laser. The ranges of resistance change needed to achieve the desired effects are the same as those described above in embodiment 2. The circuit should be designed in such way that the switch remains in position 2. Only a (manual) reset or restart, will set the switch back to position 1, after which the laser can be powered again.

Figure 2D:
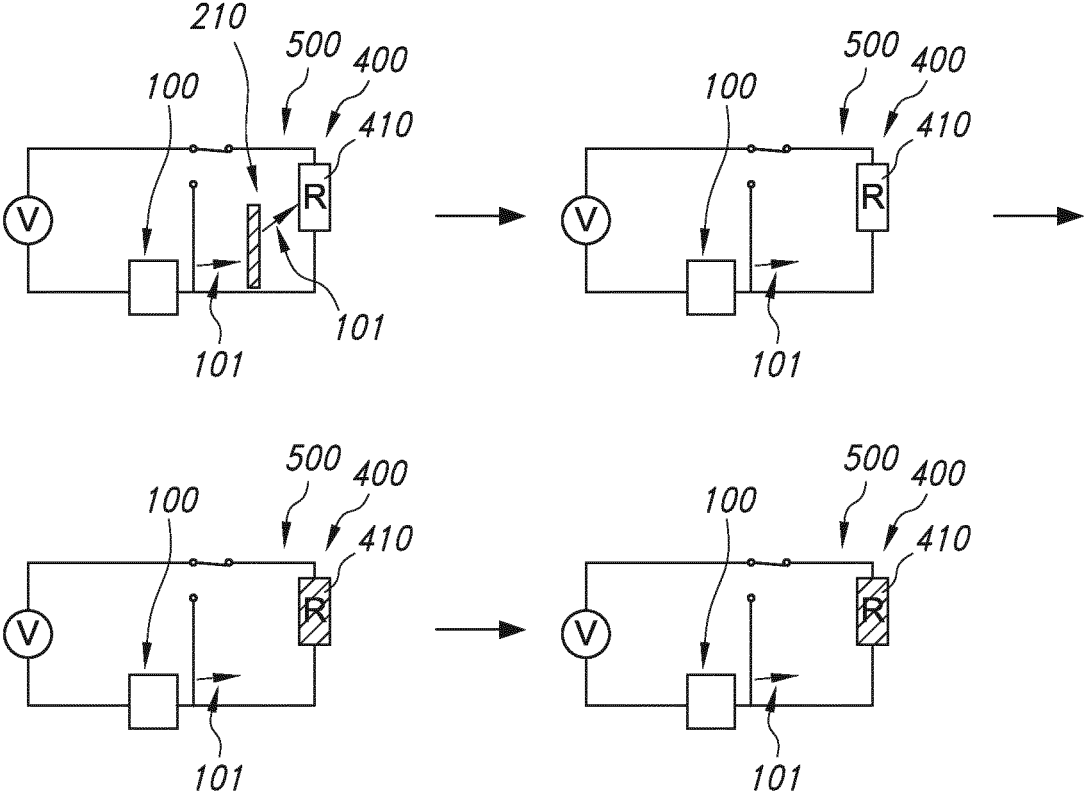

In the schematic drawing of FIG. 2d, the resistive element is positioned in the optical path, after a conversion or beam shaping element. In an alternative configuration the resistive element can also be positioned at another location, using the fact that converted light is radiated in all direction, or using an optical part to reflect the light towards the resistive element (like described in some of the above embodiments).

Figure 2E:
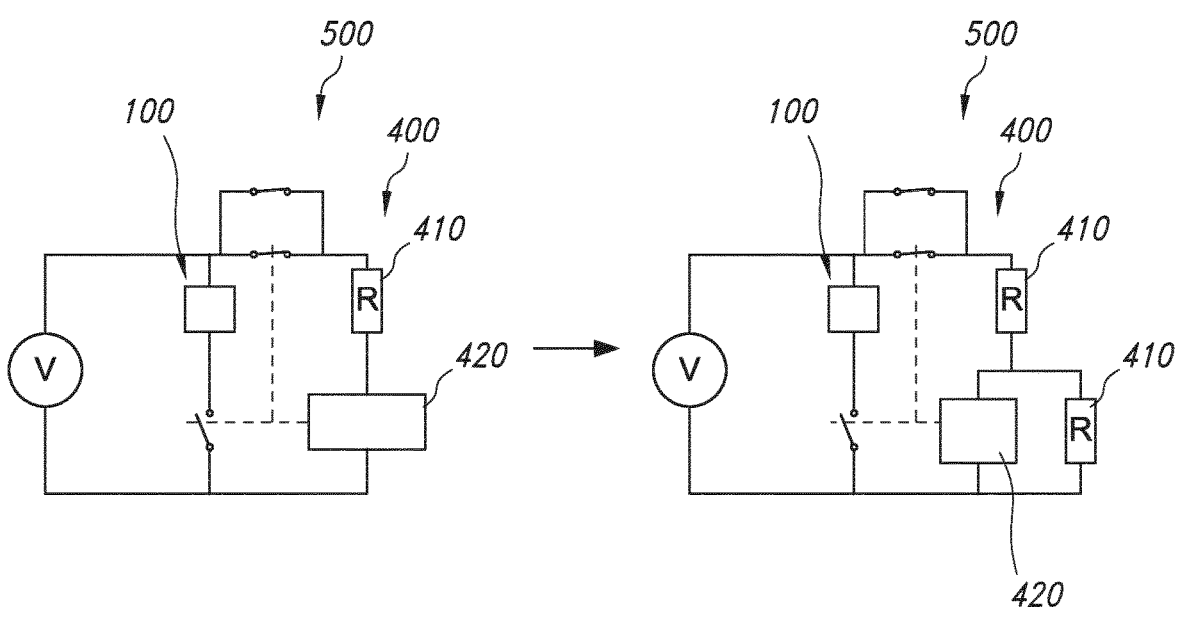

With reference to FIG. 2e, the laser current can be controlled via a (solid state) relay circuit. The relay is powered via an LDR, PTC or NTC and via one of its own contacts. When the resistance increases or decreases, the relay falls off and the current is interrupted. It can only come on after pushing of a reset switch. Advantage: simple circuit, low current through PTC/NTC means low power loss in operation.

The present invention provides configurations, simplicity and robustness of resistor based safety circuits.

When we add in a way comprising a control system, a safety protection to such configuration may be based on a photosensor, a control and electrical connections. However, safety protection based on a resistive element may require only a rerouting in the electrical circuit and a dedicated resistor between phosphor and optics/front plate.

The resistor based solution may require less and cheaper parts than photosensor based. In addition this solution can provide intrinsic safety: the electrical circuit is opened or modified in such a way that power to the laser is cut off and thus the laser will stop emitting. This will be independent of the rest of the circuit, so even in case failures occur in these parts (e.g. inside the driver) no power will go to the laser and no laser light will escape from the system. In case of a photosensor and control circuit, failure in the photosensor, control circuit and power supply may lead to an unsafe situation when power is still supplied to the laser (in principle this can happen in specific circumstances, as the circuit between power supply and laser remains intact).

Implementation can be as separate elements, or combination of the laser, phosphor and protective resistor into one package (e.g. a SMD package or a laser TO can).

Referring to FIG. 2e, in embodiments the electrical circuit 500 is configured such that in dependence of the electrical resistance of the sensor component 410, the sensor element 400 terminates the electrical power provided to the solid state light source 100 via the electrical circuit 500. Especially, in embodiments the system 1000 may further comprise a circuit component 420 selected from the group comprising a relay and a solid state switch, like a MOSFET, wherein the circuit component 420 is configured such that in dependence of the electrical resistance of the sensor component 410, the circuit component 420 terminates the electrical power provided to the solid state light source 100 via the electrical circuit 500.

In specific embodiments, the light generating system 1000 may further comprising a control unit 310 configured to prevent that the solid state light source 100 switches automatically on again after an occurrence wherein the sensor element 400 has terminated providing the electrical power to the solid state light source 100. For instance, in embodiments the control unit 310 may be configured to senses the current through the light source 100, such as laser. When the control unit 310 senses that the current drops below a specific level, such as essentially 0 A, it may switch off the power until a reset is executed.

This control unit 310 may in embodiments comprise a first input, which may comprise a current sensor (which is not the circuit component 420), a second input which is a reset signal, and a third input which is a power supply. Further, the control unit 310 may have an output to the laser, such as by closing power to the laser until the reset is executed.

Figure 2F:
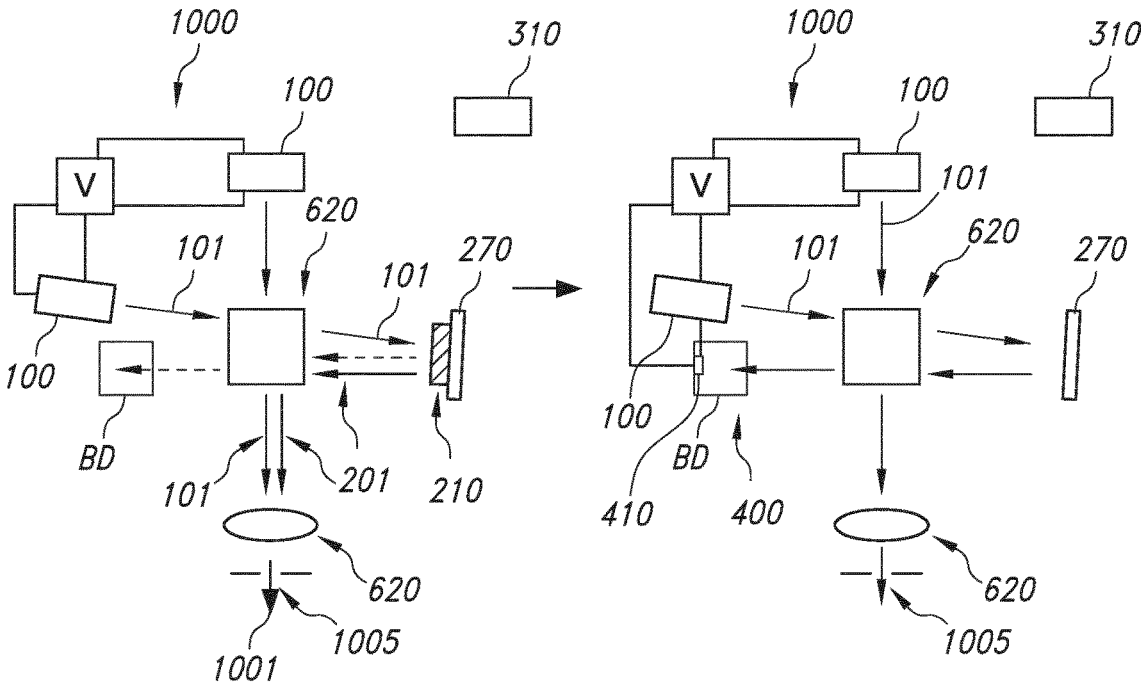

With reference to FIG. 2f, schematically an embodiment is shown of a reflective configuration. Normal operation is sketched on the left side. Separate blue lasers are used to pump the phosphor (high power) and to mix in blue light in the emitted beam (low power). The non-converted blue light from the pump laser is transmitted by the dichroic (embodiment of optical element 620) and collected in the beam dump. When the phosphor fails, the non-converted light will also be collected in the beam dump. Because the intensity is much higher than under normal operation, a safety circuit can easily be included in the beam dump. This requires a resistor in series or in parallel with the pump laser as described in the embodiments. Under high intensity blue light the resistor will change resistance and thereby switch off the power to the pump laser. Reference 1005 indicates an end window 1005 (or light exit window). Reference 270 indicates a reflector. In embodiments, there may be a reflective layer behind the luminescent element 210.

Hence, in specific embodiments, the photo-resistor as sensor component 410 may be configured in a beam dump BD. In specific embodiments, the beam dump BD may be a recess or cavity. Especially, in embodiments the beam dump BD may comprise a light absorbing material for the laser light, such as a black material (like a material with a black coating). This may improve the safety. Hence, in specific embodiments the photo-resistor as sensor component 410 may be configured in a recess or cavity of a beam dump BD.

Figure 2G:
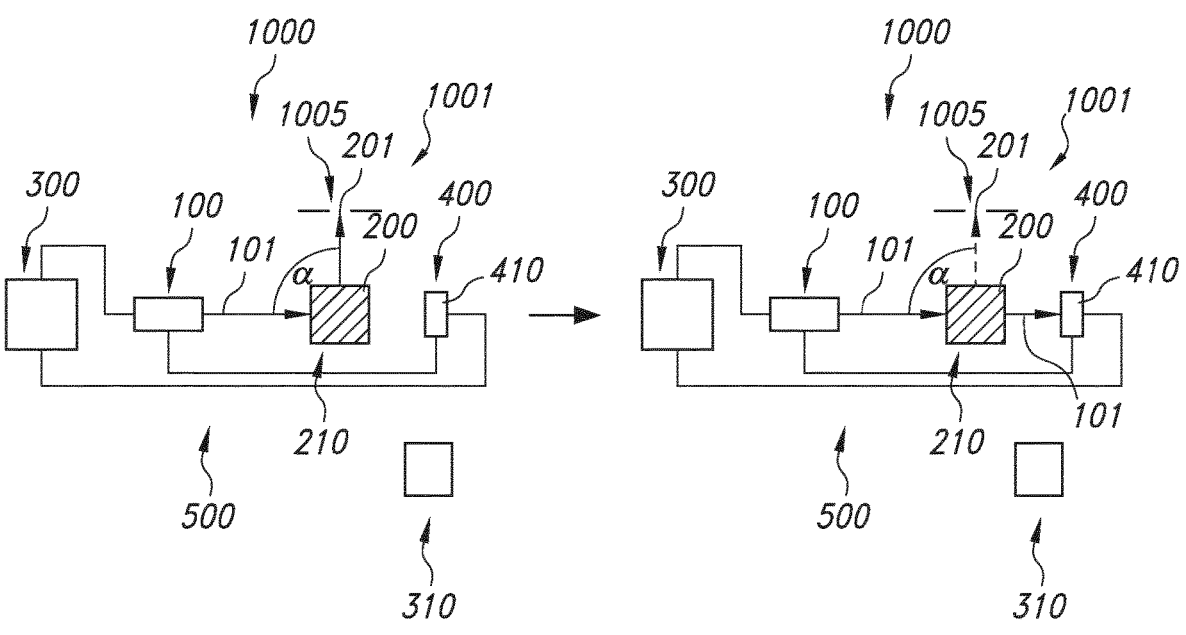

FIG. 2g schematically depict a further embodiment of a possible transmissive mode. Reference 300 may refer to a control system (or driver).

Referring to FIG. 2g, in embodiments, the light source light 101, such as laser light may be directed at the luminescent material element 210 such that specular reflection of the light source light 101 at the luminescent material element 210 will essentially not propagate together with the luminescent material light 201 to an end window 1005 of the system 1000. For instance, the end window 1005 (or light exit window) of the system 1000 may be configured under e.g. an angle of 90° relative to the luminescent material light 201 propagating to the end window 1005. In FIG. 2g, the angle α indicates this angle, which is here 90°. This may improve the safety. Other angels than 90° may also be possible, such as especially selected from the range of 20-160°, like selected from the range of 35-145°.

Figure 3:
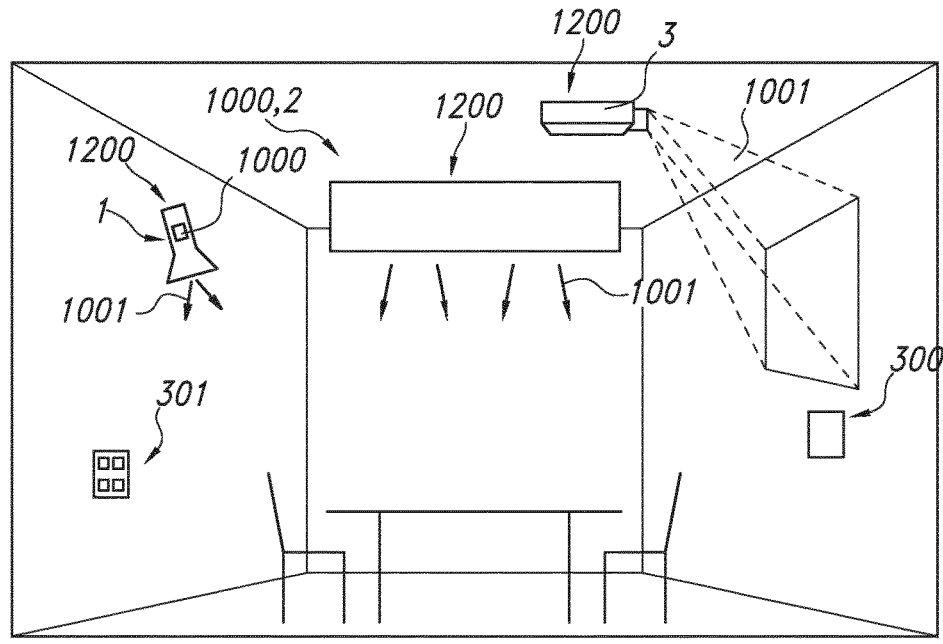
FIG. 3 schematically depict some possible applications.

FIG. 3 schematically depicts an embodiment of a luminaire 2 comprising the light generating system 1000 as described above. Reference 301 indicates a user interface which may be functionally coupled with the control system 300 comprised by or functionally coupled to the light generating system 1000. FIG. 3 also schematically depicts an embodiment of lamp 1 comprising the light generating system 1000. Reference 3 indicates a projector device or projector system, which may be used to project images, such as at a wall, which may also comprise the light generating system 1000.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

Amongst others, the invention may provide a laser safety protection method directly in the electrical circuit to dim/switch off the laser using resistance changing element in the laser electrical circuit. In embodiments, the protection method uses elements that decrease resistance upon laser exposure, which are placed in parallel with the laser device. In embodiments, the protection method uses elements that increase resistance upon laser exposure, which are placed in series with the laser device. In embodiments, the protection method uses elements that decrease resistance upon converted light exposure, which are placed in series with the laser device. In embodiments, the resistance changing element is a resistor or switch that changes resistance reversibly upon exposure. In embodiments, the resistance changing element is a NTC. In embodiments, the resistance changing element is a LDR. In embodiments, the resistance changing element is a PTC. In embodiments, the resistance changing element is a (bimetallic) switch. In embodiments, an additional control unit in the electrical circuit may be applied to prevent that the laser switches automatically on again after failure. In embodiments, the resistance changing element changes the resistance irreversibly. In embodiments, the resistance changing element may be is a fuse or $0\Omega$ resistor that causes an open circuit after exposure. In embodiments, the resistance changing element may be located in the optical path. In embodiments, the resistance changing element may be placed after the conversion element/phosphor. In embodiments, the resistance changing element may be placed after a beam shaping element (lens, reflector). In embodiments, the resistance changing element may be placed at multiple locations in the optical part. In embodiments, the resistance changing element may be exposed to blue laser light after failure.

The invention claimed is:

1. A light generating system comprising a solid state light source, a luminescent material element, a sensor element, and an electrical circuit, wherein:

the solid state light source is configured to generate light source light-939, wherein the solid state light source; is functionally coupled to the electrical circuit;

the luminescent material element comprises a luminescent material, wherein the luminescent material element is configured in a light receiving relationship with the solid state light source, and wherein the luminescent material is configured to convert at least part of the light source light into luminescent material light; and the sensor element comprises a sensor component, wherein the sensor element is comprised by the electrical circuit, wherein the sensor component comprises a photo-resistor, wherein the photo-resistor has a variable resistance dependent on an extend of exposure to a light selected from the group consisting of the laser light and the luminescent material light; and wherein one or more of the following applies: (i) the sensor component is configured to decrease resistance upon increased intensity of the light source light, wherein the sensor component is configured in parallel with the solid state light source; (ii) the sensor component is configured to increase resistance upon increased intensity of the light source light, wherein the sensor component is configured in series with the solid state light source; (iii) the sensor component is configured to decrease resistance upon increased intensity of the luminescent material light, wherein the sensor component is configured in series with the solid state light source; and (iv) the sensor component is configured to increase resistance upon increased intensity of the luminescent material light, wherein the sensor component is configured in parallel with the solid state light source; and wherein the light source comprises a laser light source, and wherein the electrical circuit is configured such that a change in resistance of the photoresistor leads to a lowering of the current and/or voltage to the laser light source and thus dimming down or shutting off the laser light source.

2. The light generating system, according to claim 1, wherein the luminescent material element is configured remote from the solid state light source, wherein the solid state light source comprises one or more of a laser diode and a superluminescent diode, and wherein the sensor component is configured to increase or decrease its resistance in the electrical circuit in dependence of one or more of the extend of exposure to the light and the extend of heat received.

3. The light generating system 890; according to claim 1, wherein one or more of an intensity of (i) the luminescent material light received by the sensor element, and (ii) an intensity of the laser light received by the sensor element, depends on a presence and absence of at least a predetermined part of a functional component in the light generating system, wherein the functional component is selected from the group comprising the luminescent material element and an optical component.

4. The light generating system according to claim 1, wherein the luminescent material element is configured in a transmissive mode, and wherein the sensor component is configured downstream of the luminescent material element.

5. The light generating system according to claim 1, wherein the luminescent material element is configured in a reflective mode, and wherein the following applies: (i) the sensor component is configured downstream of the luminescent material element and is configured to receive at least part of the light source light reflected at the luminescent material element, or (ii) the sensor component is configured to receive light source light in the absence of a predetermined part of the luminescent material element and is configured to receive no or a reduced intensity of the light source light in the presence of the predetermined part of the luminescent material element.

6. The light generating system according to configuration (iii) and/or configuration of claim 1, wherein:

when (iii) the sensor component is configured to decrease resistance upon increased intensity of the luminescent material light, and wherein the sensor component is configured in series with the solid state light source, then the sensor component is also configured to increase resistance upon decreased intensity of the luminescent material light; and/or when (iv) the sensor component is configured to increase resistance upon increased intensity of the luminescent material light, and wherein the sensor component is configured in parallel with the solid state light source, then the sensor component is configured to decrease resistance upon decreased intensity of the luminescent material light.

7. The light generating system according to configuration (iii) and/or configuration (iv) of claim 1, wherein the sensor component is configured to change resistance reversibly.

8. The light generating system according to configuration (i) and/or configuration (ii) of claim 1, wherein the sensor component is configured to change resistance irreversibly.

9. The light generating system according to claim 1, wherein the electrical circuit is configured such that in dependence of the electrical resistance of the sensor component, the sensor element terminates the electrical power provided to the solid state light source via the electrical circuit.

10. The light generating system according to claim 9, further comprising a circuit component selected from the group comprising a relay and a solid state switch, wherein the circuit component is configured such that in dependence of the electrical resistance of the sensor component, the circuit component terminates the electrical power provided to the solid state light source via the electrical circuit.

11. The light generating system according to claim 9, further comprising a control unit configured to prevent that the solid state light source switches automatically on again after an occurrence wherein the sensor element has terminated providing the electrical power to the solid state light source.

12. The light generating system according to claim 1, wherein the sensor component is configured to receive stray light of one or more of the solid state light source and the luminescent material.

13. The light generating system according to claim 1, comprising a plurality of sensor elements configured at different positions within the light generating system.

14. A light generating device selected from the group of a lamp a luminaire, a projector device, a disinfection device, and an optical wireless communication device, comprising the light generating system according to claim 1.

* * * * *